(12) United States Patent
Willis (10) Patent No.: US 9,744,727 B2
(45) Date of Patent: Aug. 29, 2017

(54) ELECTRO-MECHANICAL 3D PRINTING DESIGN SYSTEM

(71) Applicant: Autodesk, Inc., San Rafael, CA (US)

(72) Inventor: Karl Willis, Millbrae, CA (US)

(73) Assignee: Autodesk, Inc., San Rafael, CA (US)

( * ) Notice: Subject to any disclaimer, the term of this patent is extended or adjusted under 35 U.S.C. 154(b) by 768 days.

(21) Appl. No.: 14/243,274

(22) Filed: Apr. 2, 2014

(65) Prior Publication Data

US 2015/0283760 A1   Oct. 8, 2015

(51) Int. Cl.
| | |
|---|---|
| *G06F 19/00* | (2011.01) |
| *B29C 67/00* | (2017.01) |
| *G06F 17/50* | (2006.01) |
| *B33Y 50/02* | (2015.01) |
| *B33Y 50/00* | (2015.01) |

(52) U.S. Cl.
CPC ...... *B29C 67/0088* (2013.01); *G06F 17/5086* (2013.01); *B33Y 50/00* (2014.12); *B33Y 50/02* (2014.12)

(58) Field of Classification Search
None
See application file for complete search history.

(56) References Cited

U.S. PATENT DOCUMENTS

| | | | | |
|---|---|---|---|---|
| 7,818,089 | B2* | 10/2010 | Hanna | A21C 9/04 |
| | | | | 221/24 |
| 9,345,147 | B2* | 5/2016 | Doyle | H05K 13/0061 |
| 9,395,718 | B1* | 7/2016 | Church | G05B 19/4097 |
| 2011/0096313 | A1* | 4/2011 | Bagheri | G03B 27/54 |
| | | | | 355/67 |

FOREIGN PATENT DOCUMENTS

FR    EP 2706559 A1 *  3/2014  ............ H01L 22/20

* cited by examiner

*Primary Examiner* — Evral E Bodden
(74) *Attorney, Agent, or Firm* — Fish & Richardson P.C.

(57) ABSTRACT

A computer-implemented layout tool includes a mechanical design engine for configuring mechanical design components to be included in a design, an electrical design engine for configuring electrical components to be included in the design, a constraint engine for identifying a 3D printer to be used to print the design and to provide design constraints including feedback for inoperative or impermissible configurations of one or more mechanical components or electrical pathways associated with the design; and a simulation engine for simulating, at least, electrical performance of the design based on one or more electrical components added to the design after printing and proposed electrical pathways.

21 Claims, 9 Drawing Sheets

ELECTRO-MECHANICAL 3D PRINTING DESIGN SYSTEM

TECHNICAL FIELD

This disclosure relates generally to three-dimensional (3D) printing systems.

BACKGROUND

Three-dimensional (3D) printing includes processes for making a 3D structure based on a digital model. Some types of 3D printing processes build the structure by adding (or "printing") relatively thin layers of material, one on top of the other, until the desired 3D structure is formed. Other types of 3D printing processes build the structure by adding material three-dimensionally. That is, rather than forming a 3D structure by accumulating layers of material, these processes build the 3D structure by moving a print head in three dimensions, and adding material wherever is needed in order to build the 3D structure.

SUMMARY

An example computer-implemented layout tool may include the following: a mechanical design engine for configuring mechanical design components to be included in a design, where the mechanical design engine is for generating a user interface (UI) for manipulation by a user for constructing the design, where the UI includes a plurality of tools for placing mechanical components included in a library and for constructing mechanical components for inclusion in the design, and where the design is to be printed on a three-dimensional (3D) printer; an electrical design engine for configuring electrical components to be included in the design, where the electrical design engine is for generating a UI for manipulation by a user for laying out electrical pathways associated with an electrical portion of the design, and where the electrical pathways are to be printed adjacent to one or more surfaces of mechanical components of the design; a constraint engine for identifying the 3D printer to be used to print the design and to provide design constraints including feedback for inoperative or impermissible configurations of one or more mechanical components or electrical pathways associated with the design; and a simulation engine for simulating, at least, electrical performance of the design based on one or more electrical components added to the design after printing and proposed electrical pathways. Example implementations may include one or more of the following features, either alone or in combination.

The electrical design engine may be configured to enable layout of the electrical pathways through automatic or manual conductive trace placement on the design. The electrical design engine may include an optimization engine for optimizing the electrical pathways based, at least in part, on 3D aspects of the design. The optimization engine may be configured to review the design and to propose electrical pathways that satisfy electrical needs of the design while taking into account 3D structures included in the design.

The simulation engine may be configured to perform simulations for performance testing of electrical performance of the design. The simulation engine may include a recommendation component to recommend changes to mechanical or electrical portions of the design based on one or more simulations. The example computer-implemented layout tool may include a library of electrical components that is accessible by the simulation engine to simulate electrical performance of the design.

The electrical design engine and the mechanical design engine may be integrated such that selection of a component for inclusion in the design includes automatic or manual configuration of both electrical and mechanical requirements for the component. Selection of an electrical component may include automatic generation of electrical pathways to support functionality of the electrical component in the design, along with automatic generation of one or more mechanical supports to facilitate mounting the electrical component in the design. The one or more supports may include mechanical holders or frames for securing the electrical component in the design.

The example computer-implemented layout tool may include a fabrication support engine configured to evaluate a fabrication potential associated with the design. The fabrication support engine may be configured to providing suggestions for improving the design based on fabrication parameters associated with the 3D printer. The fabrication support engine may be configured to produce metadata to be associated with the design. The metadata is usable in instructions for the 3D printer to print the design. The instructions may include one or more pause or control instructions for controlling the 3D printer when printing the design to enable alternating between different materials for use in printing the design or placement of external components on the design.

The example computer-implemented layout tool may include a printer configuration tool configured to provide a control for selecting a 3D printer for use in printing the design. The constraint engine may be configured to evaluate the design based on a selected 3D printer and to provide one or more recommendations regarding changes to be made to the design to accommodate printing on the selected 3D printer.

The example computer-implemented layout tool may include a print engine for evaluating the design, and for outputting print instructions associated with the design to control printing of mechanical and electrical portions of the design. The instructions may include alternating instructions to print mechanical, electrical, then mechanical structures in support of the design.

The simulation engine may be configured to operate in a simulation environment for simulating an integration of electrical and mechanical portions of the design, where the simulating includes verifying functional requirements of the design that include both mechanical and electrical parameters.

The design may be printable on a 3D printer that generates structure by additive layering or on a 3D printer that generates structure by printing in three dimensions. The UI may be configured to accept freeform drawings and to generate at least part of the design based on the freeform drawings.

The systems described herein, or portions thereof, can be implemented as a computer program product that includes instructions that are stored on one or more non-transitory machine-readable storage media, and that are executable on one or more processing devices to perform or control the operations described herein. The systems described herein, or portions thereof, can be implemented as an apparatus, method, or electronic system that can include one or more processing devices and memory to store executable instructions to implement various operations.

The details of one or more implementations are set forth in the accompanying drawings and the description below.

Other features and advantages will be apparent from the description and drawings, and from the claims.

DESCRIPTION OF THE DRAWINGS

Like reference numerals in different figures indicate like elements

DETAILED DESCRIPTION

Described herein are implementations of a 3D printing system. As described below, a 3D printing system may be used to build a 3D structure having both mechanical and electrical components. These mechanical and electrical components may be functional and/or structural.

Some mechanical components may be non-movable and purely structural. Such components may define the shape of the 3D structure. For example, a 3D structure may include a model of an automobile. In this example, non-movable mechanical components may include the body and the chassis of the automobile. Some mechanical components may be movable. In the automobile example, movable components may include, e.g., the wheels, axles, doors, and so forth, of the automobile. In some cases, the components used to achieve movement, such as hinges or the like, are also built using 3D printing. In other cases, some or all of these components are not produced using 3D printing, but rather are added to a 3D-printed structure.

Functional electrical components may also be built using 3D printing. For example, simple electrical pathways, such as a conductive trace, may be built by layering conductive material using 3D printing. More complex electrical components, such as capacitors, resistors, inductors, and the like, may also be built using 3D printing. In some implementations, materials used to build electrically-conductive components are different than materials used to build mechanical components. As with standard circuitry, 3D-printed circuitry may be a mix of electrical components, including conductive traces, and insulating material on which the electrical components are mounted and which prevents unintended electrical connections between conductive portions.

3D printing may also be used to build appropriate connections between electrical and mechanical components, thereby enabling a resulting structure to function (e.g., to move) in response to an electrical input. In the example described above, 3D printing may be used to build, at least in part, a motor for driving the axle of the model automobile. The motor may be a combination of mechanical and electrical components. For example, the motor may include a rotor, a stator, and associated structures, such as a pinion and a gearwheel. In this example, the rotor turns the pinion to drive the gearwheel connected to the axle of the car. The rotor includes conductors that pass current and that are responsive to magnetic fields produced by the stator to generate force needed to turn the pinion. All or part of these (and other) components may be built using a 3D printing system, such as that shown in FIG. 1.

Figure 1:
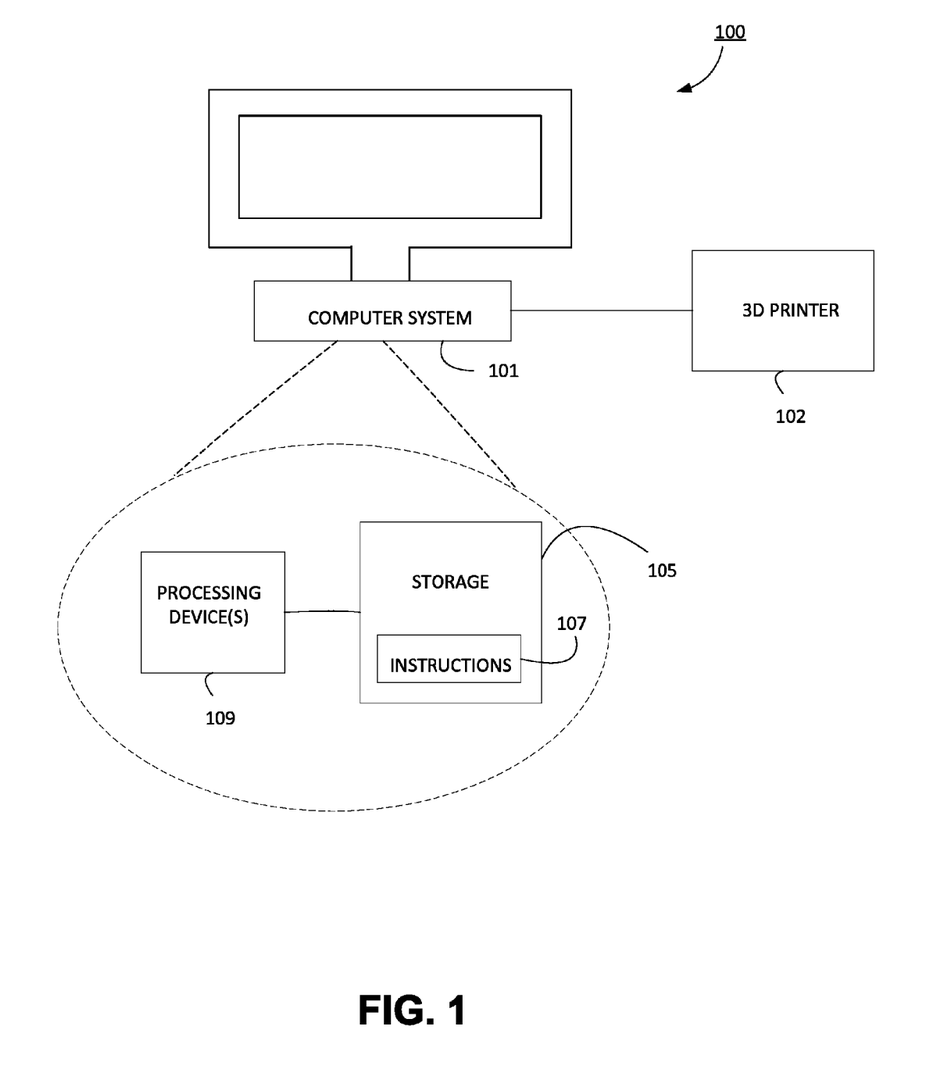
FIG. 1 is a block diagram showing components of an example 3D printing system.

Referring to FIG. 1, an example implementation of a 3D printing system 100 includes a computer system 101 and a 3D printer 102. In this example implementation, computer system 101 includes, or has access to, storage 105 containing executable instructions 107 that constitute a layout tool to create designs to be printed and to control the 3D printer, among other functions. The instructions define various operational engines, and are executable by one or more processing devices 109 to perform operations such as those described below. Although a single computer is shown in FIG. 1, the various engines described herein may be executed on different machines, and may be operable with more than one 3D printer.

Figure 2:
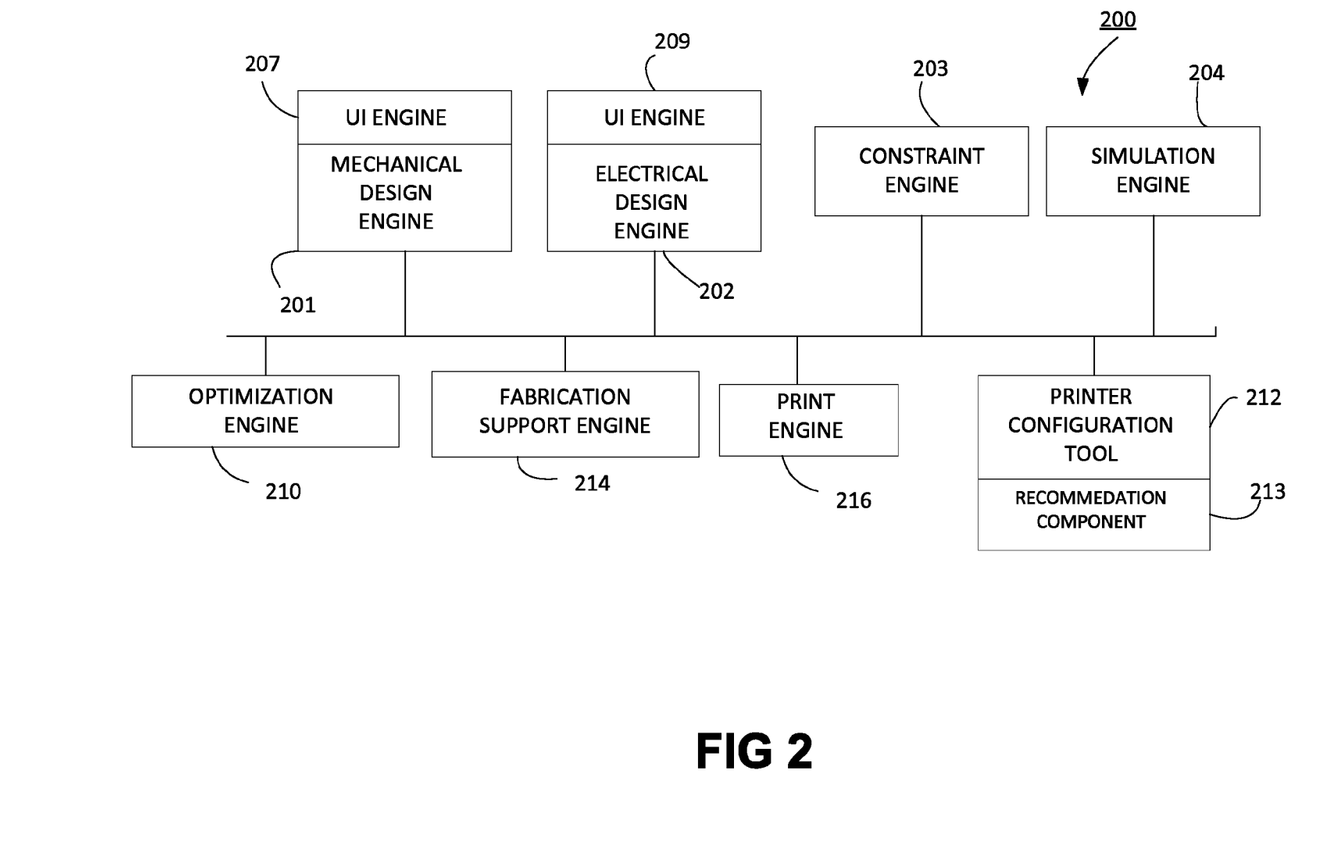
FIG. 2 is a block diagram showing components of an example layout tool for use with a 3D printing system.

Referring to FIG. 2, an example layout tool 200 for use with 3D printer 102 includes, but is not limited to, the following: mechanical design engine 201, electrical design engine 202, constraint engine 203, and simulation engine 204. The other engines depicted in FIG. 2 are described, in turn, below. Although the various engines of FIG. 2 are depicted as separate graphical blocks, in some implementations executable instructions for different engines may be resident in total, or in part, in the same computer modules or routines. The various engines of FIG. 2 may communicate with each other, as depicted conceptually by their common connection.

In this example, mechanical design engine 201 operates to receive input and to configure mechanical design components to be included in a digital model of a 3D design (or 3D structure) to be built by 3D printing system 100. A configuration process associated with the mechanical design engine 201 may include specifying parameters for the mechanical design components. For example, the parameters may include a type of a component, size(s) of the component, material(s) from which the component is to be constructed, location(s) of the component in the resulting 3D structure, and any other appropriate characteristics for the component. Parameters for each component may be obtained from one or more menus containing sets of predefined parameters, or they may be added by the user. The manner in which parameters are specified may be specific to the type of 3D printing system used.

In some 3D printing systems, mechanical design engine 201 includes a user interface (UI) engine 207 to generate, for display on a computer peripheral or other display screen, a UI that can be manipulated by a user to construct a virtual model of the design. For example, the user interface may include software tools for selecting virtual mechanical components, and for placing those virtual mechanical components into a digital model that is translatable into instructions for controlling the 3D printer to print the design. For example, referring to FIG. 3, an example UI 300 may include a menu 301 of control functions, a library area 302 containing predefined mechanical components, and a work area 304 for constructing the digital model. In this regard, the components in the IU, including the predefined components, are virtual in that they are computer-generated and defined for use with the digital model.

Figure 3:
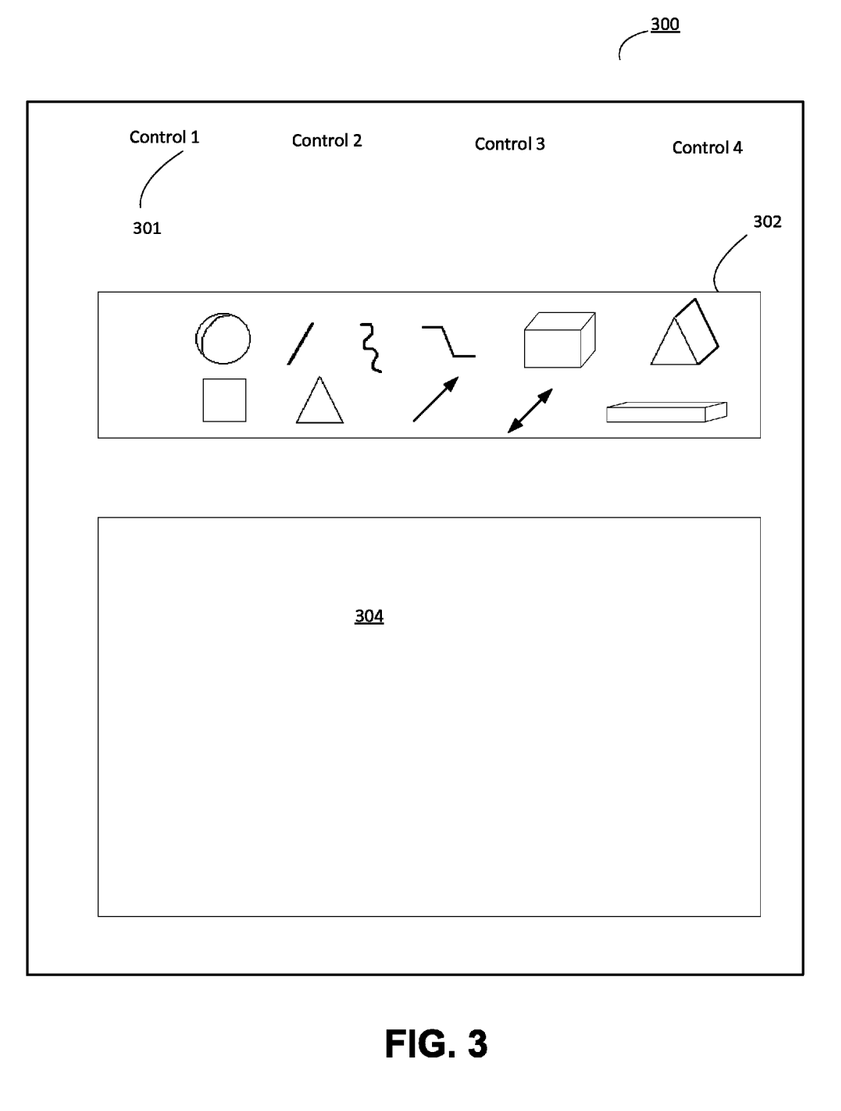
FIG. 3 is an example user interface that may be generated by the layout tool for incorporating mechanical components into a design.

In some implementations, the digital model may be constructed from the predefined mechanical components, e.g., by dragging, dropping, and arranging those components in work area 304. In some implementations, the control functions may include one or more controls by which a user may define custom components for inclusion in the library and/or the digital model. For example, the 3D printing system may include sub-components or other features that enable a user to construct custom components that can be incorporated into the digital model in the same way as the predefined components.

In some implementations, a user may drag and drop a mechanical component from library area 302 into work area 304. The user may position that mechanical component manually. If there are already mechanical or other (e.g., electrical) components in the work area, mechanical design engine 201 may predict, for example based on the user's placement of a mechanical design component and proximity to mechanical (or electrical) design component(s) already in the work area, how the newly-placed mechanical design component will fit with and/or connect to component(s) already in the work area. Mechanical design engine 201 may then suggest an appropriate connection or place the component automatically including the appropriate connection. The user may agree to the suggested connection or disagree and create a manual connection using one or more of the control features of UI 300.

In some implementations, UI engine 207 allows a user to draw or to sketch traces onto the work area "freeform". For example, using a mouse, a light pen or touch, a user may sketch the outlines of a drawing on the work area. UI engine 207 may accept a drawing, including two-dimensional (2D) drawings, infer 3D positions of elements of the drawing, and produce/suggest a virtual 3D model from the drawing in the work area. The user may be presented with an option to accept, reject, or modify the suggested 3D model. If there is an existing 3D model displayed in the work area, UI engine 207 may suggest connections of the drawing(s) to the existing 3D model. In some implementations, UI engine 207 may cause the drawings to conform (or "snap") to the existing 3D model or to one or more empty parts of the work area. In some implementations, snapping may occur as content, such as a drawing, is input, thereby giving the user immediate feedback about the model. In other implementations, snapping may occur in response to user input, after the content has been input.

Figure 4:
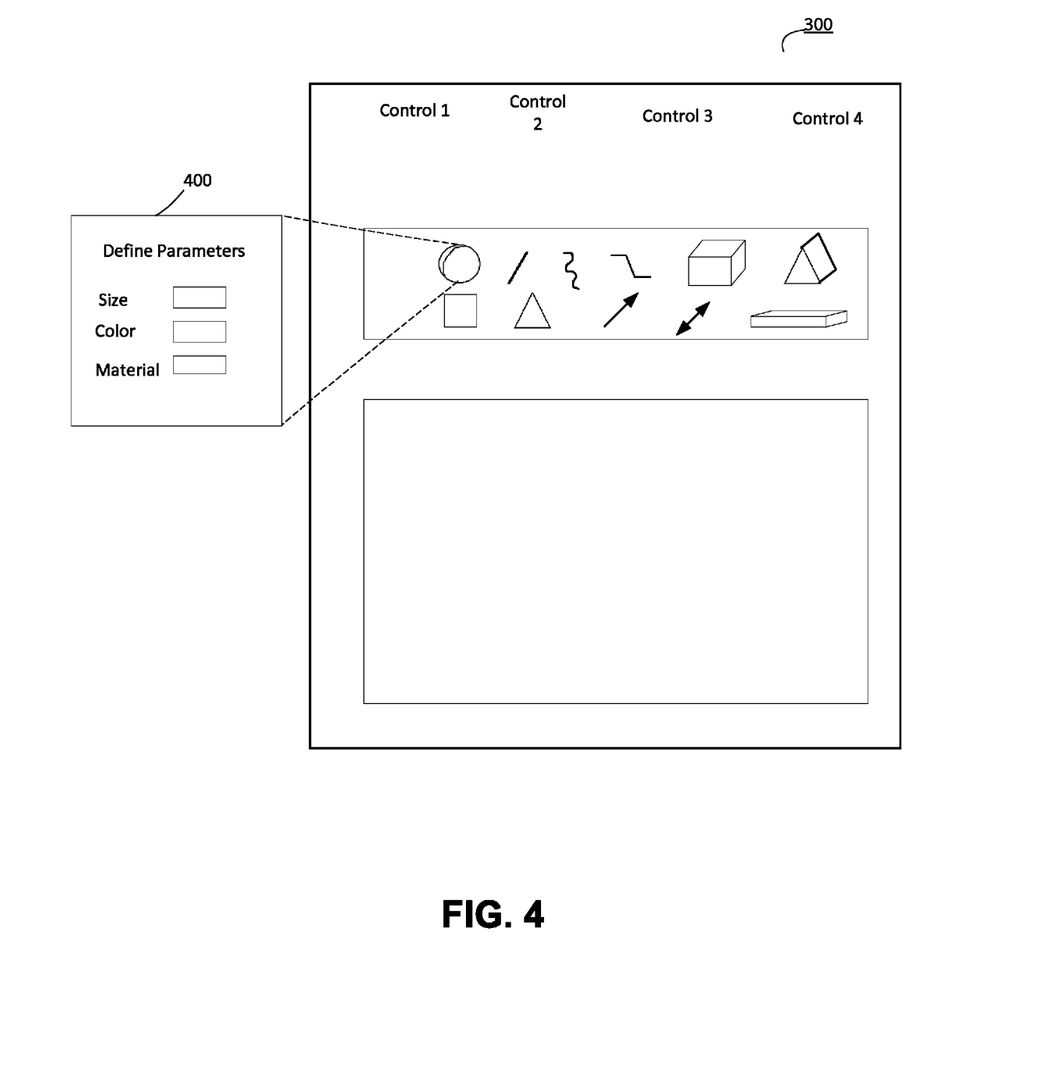
FIGS. 4 and 5 are examples of menus that may be generated by a user interface for changing parameters of displayed components.
Figure 5:
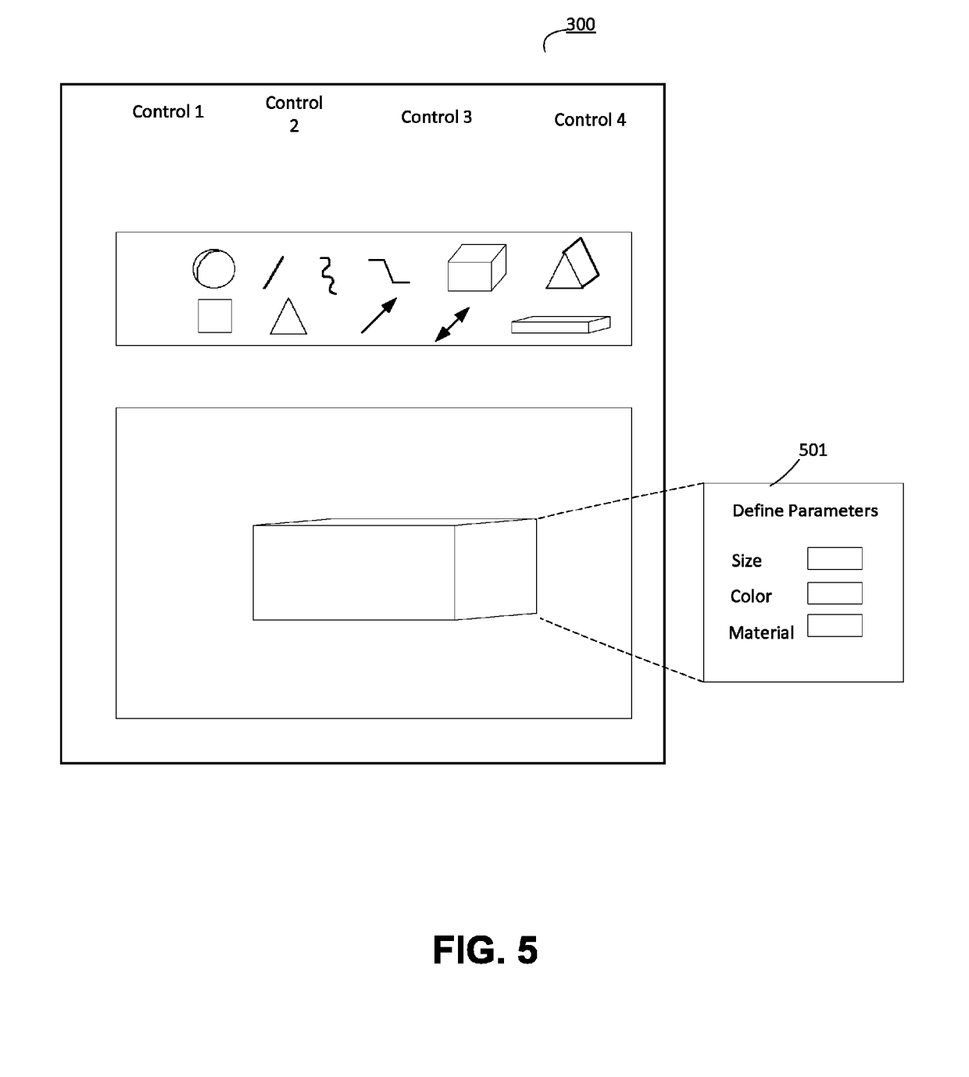

Parameters associated with a mechanical component may be defined at any appropriate point during construction of the digital model. For example, in some implementations, a mechanical component may be selected in library area 302. In response, a menu, such as menu 400 of FIG. 4, may pop-up on the user's computer screen, through which the user may define parameters, such as the size, material, type, and so forth, of the component. In some implementations, this information may be added using one or more pull-down menu(s) from menu 301 of control functions. In some implementations, a user may right-click, using a computer mouse, on a component in the work area, which causes a menu, such as menu 501, to pop-up on the screen, as shown in FIG. 5. The user may then assign appropriate parameters using that menu. In some examples, such as for user-defined components, the parameters may not be changeable. The parameters can be stored in memory in association with the component.

Library area 302 may be populated with components from one or more component database(s), including system-defined and/or user-defined databases. These databases may be stored locally, e.g., in the memory of computer system 101, or remotely, e.g., in one or more servers that are accessible to the computer system via a network, such as the Internet. In some implementations, different libraries may be appropriate for different types of 3D designs. For example, a library for building an artificial hip may contain different components than a library for building a model automobile. In some implementations, a number of default, specialized (e.g., based on the design) or customized libraries may be accessible.

Figure 6:
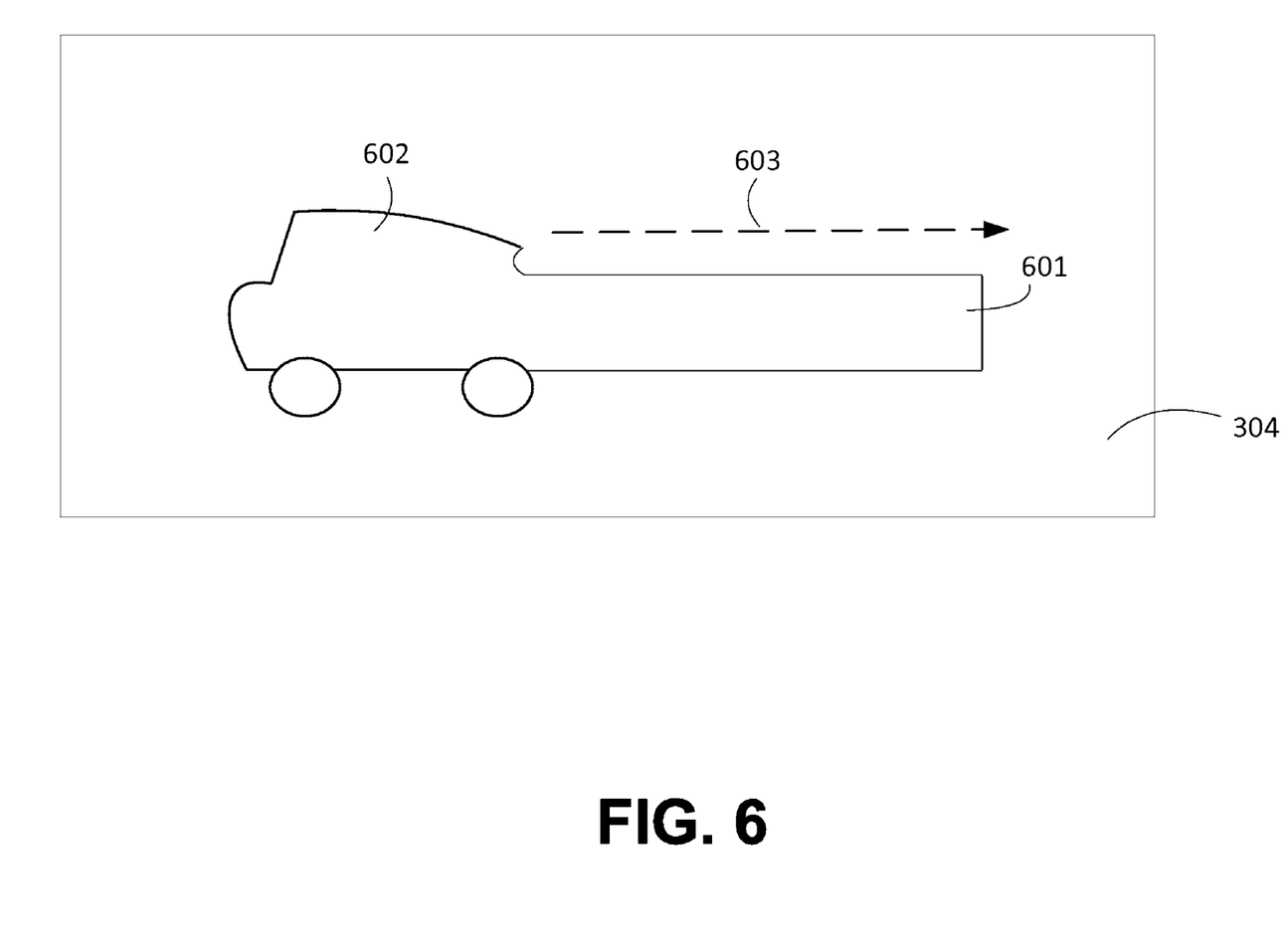
FIG. 6 is an example of a design produced by the layout tool.

Once a component is in work area 304, mechanical design engine 201 may display that component according to the parameters specified for that component. For example, if a specified component is to be red and twice as long as all other components in the work area, the specified component is displayed as red and to scale. Mechanical design engine 201 may also enable modification of components displayed in work area 304. For example, a user may select a component displayed in work area 304. In response, mechanical design engine 201 may recognize that the component has been selected and enable a user to add to, subtract from, modify, replicate, configure or distort, the selected component. For example, referring to FIG. 6, a user may remove a selected element of a component 602 or distort a selected element 601 by dragging an edge of that element in one direction or another, e.g., in the direction of arrow 603.

Example 3D printing system 100 also includes electrical design engine 202. Electrical design engine 202 is similar to mechanical design engine 201 above. In this example, electrical design engine 202 is for configuring electrical design components to be included in the digital model of a 3D design. The configuration process may include specifying parameters for the electrical design components. For example, the parameters may include a type of a component (e.g., a conductive trace, a resistor, a capacitor, a chip, and so forth), values of the component (e.g., a trace length, a resistance, a capacitance, chip part number, and so forth), material(s) from which the component is to be constructed (e.g., a particular type of conductive material), location(s) of the component in the resulting 3D structure, and any other appropriate characteristics for the component. Parameters for each component may be obtained from one or more menus containing sets of predefined parameters, or they may be added by the user. The manner in which parameters are specified may be specific to the type of 3D printing system used.

In some 3D printing systems, electrical design engine 202 includes a UI engine 209 to generate, for display on a computer peripheral or other display screen, a UI that can be manipulated by a user to construct the electrical portion of the design. For example, the user interface may include software tools for selecting virtual electrical components, and for placing those virtual electrical components into a digital model that is usable by the 3D printing system. For example, referring to FIG. 7, the UI may include a menu of control functions 701, a library area 702 containing predefined electrical components, and a work area 704 for constructing a digital model. In some implementations, work area 704 may be the same work area as work area 304, thereby allowing the same model to be acted-upon by both the electrical and mechanical design engines. In some implementations, work areas 304 and 704 may be different work areas, with models being ported between the two. As above, the components, including the predefined components in the UI are virtual in that they are computer-created and defined for use with the digital model. In some cases, electrical components are formed on top of or otherwise integrated with an existing mechanical design; however, this need not be the case. Rather, an electrical design may be formed, and mechanical components added thereto using mechanical design engine 201.

Figure 7:
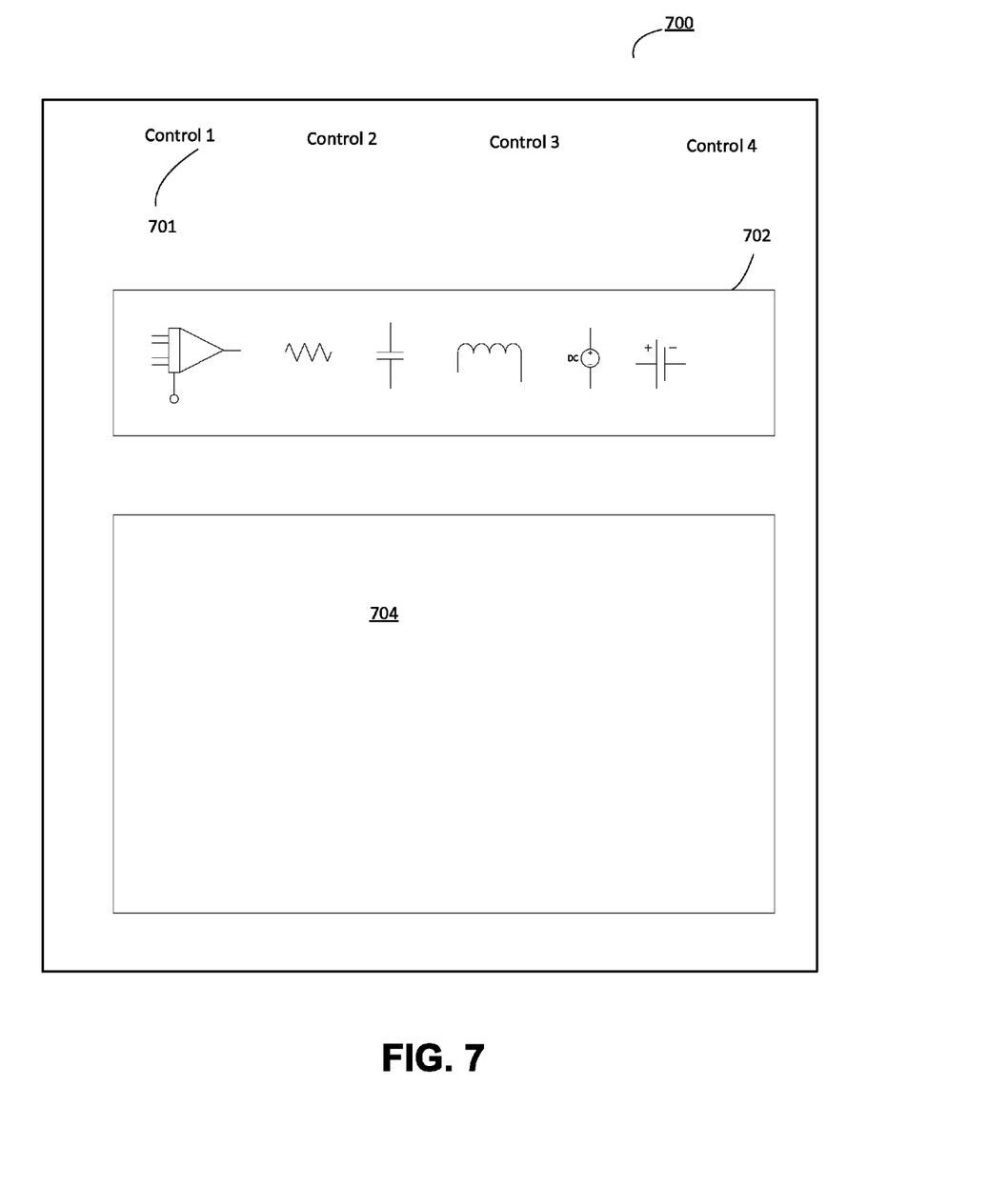
FIG. 7 is an example user interface that may be generated by the layout tool for incorporating electrical components into a design.

In some implementations, the digital model may be constructed using predefined electrical components, e.g., by dragging, dropping, and arranging those components in work area 704. For example, a user may select a conductive trace, and use the selected conductive trace to lay-out an electrical pathway between electrical components in the digital model. The electrical trace may be subsequently used to lay-out additional traces forming a circuit or other group of electrical pathways. In some implementations, the control functions may include one or more controls by which a user may define custom components for inclusion in the library and/or digital model. For example, the 3D printing system may include sub-components or other features that enable a user to construct custom components that can be incorporated into the digital model in the same way as the predefined components. For example, a user may define a component as a combination of electrical components, e.g., an amplifier comprised of an op-amp and a feedback resistor, and store that definition for future use.

In some implementations, a user may drag and drop an electrical component from library area 702 into work area 704. The user may position that electrical component manually. If there are already electrical or mechanical components in the work area, electrical design engine 202 may predict, based on the user's placement of the electrical design component and proximity to pre-existing components in the work area, how the newly-placed electrical design component will fit with and/or connect to the electrical design component(s) already in the work area. Electrical design engine 202 may then suggest an appropriate connection or automatically add a connection (such as to power and ground). The user may agree to the suggested connection or disagree and create a manual connection using one or more of the control features of the UI. In some implementations, the user may specify electrical constraints, such as maximum impedance, maximum permissible magnetic interference, maximum capacitance, and so forth. Electrical design engine 202 may take this information into account and, if necessary, re-route electrical pathways and/or re-position electrical components so as to comply with these electrical constraints. Thus, the system may be configured both for automatic and manual placement of electrical elements.

As was the case above with UI engine 207, in some implementations, UI engine 209 allows a user to draw or to sketch traces onto the work area "freeform". For example, using a mouse, a light pen or touch, a user may sketch the outlines of a drawing on the work area. The drawing may include mechanical and/or electrical components. UI engine 209 may accept a drawing, including 2D drawings, infer 3D positions of elements of the drawing, and produce/suggest a virtual 3D model from the drawing in the work area. The user may be presented with an option to accept, reject, or modify the suggested 3D model. If there is an existing virtual 3D model displayed in the work area, UI engine 209 may suggest connections of the drawing(s) to the existing 3D model. In some implementations, UI engine 209 may cause the drawings to snap to the existing 3D model or to one or more empty parts of the work area. In some implementations, snapping may occur as content, such as a drawing, is input, thereby giving the user immediate feedback about the model. In other implementations, snapping may occur in response to user input, after the content has been input.

In some implementations, an application programming interface (API) may be used to input content to the work area programmatically. For example, a programming environment, which may be, e.g., text based or graphical, may enable the user to write scripts to dynamically lay-out mechanical/electrical components, such as LED arrays, for inclusion into the work area.

In some implementations, system 200 (FIG. 2) may include an optimization engine 210 configured to optimize electrical pathways and/or other electrical circuitry or mechanical structures based at least in part on 3D aspects of a design. In this regard, the mechanical portion of a design may include one or more features that block or otherwise disadvantageously interact with portions of the electrical design. Accordingly, the optimization engine may analyze the mechanical and electrical design defined by the digital model in order to determine better routes, through the design, for electrical pathways and/or better areas on which to place specific structures. In an example, optimization engine 210 may review the design, including the three-dimensional aspects of the design, and propose electrical pathways that satisfy electrical constraints of the design while taking advantage of three dimensional structures included in the design or compensate (or optimize) for limitations of an 3D printer on which the design will be printed. For example, the optimization engine 210 may elect to route an electrical pathway over or around a mechanical component. Optimization engine 210 may perform similar functions for other electrical components. For example, stray magnetic fields may have an adverse effect on some components. Accordingly, optimization engine 210 may identify locations of such components and magnetic fields, and suggest placement of the identified components so that they do not interact with those magnetic fields. In some implementations, optimization engine 210 may be part of electrical design engine 202.

Parameters associated with an electrical component may be defined at any appropriate point during construction of the digital model. For example, in some implementations, an electrical component may be selected from the library area of FIG. 7. In response, a menu may pop-up, through which the user may define parameters, such as the size, performance, type, and so forth, of the component. As above, this information may be added using one or more pull-down menu(s) from the menu of control functions. In some implementations, a user may right-click, using a computer mouse, on a component in the work area, which causes a menu to pop-up on the screen. The user may then assign appropriate parameters using that menu. In some examples, such as for user-defined components, the parameters may not be changeable. The menus described here are similar to those described with respect to FIGS. 4 and 5.

Library area 702 may be populated with components from one or more component database(s), including system-defined and/or user-defined databases. These databases may be stored locally, e.g., the memory of the computer system controlling the 3D printing system, or remotely, e.g., in one or more servers that are accessible to the computer system via a network, such as the Internet. In some implementations, different libraries may be appropriate for different types of 3D designs. For example, a library for building an analog circuit may contain different components than a library for building a digital circuit. In some implementations, a number of standard, design specific or custom libraries may be accessible.

Once a component is in the work area, electrical design engine 202 may display that component according to the parameters specified for that component. Electrical design engine 202 may also enable modification of components displayed in work area 704. For example, a user may select a component displayed in work area 704. In response, electrical design engine 202 may recognize that the component has been selected and enable a user to change parameters associated with selected component. For example, a user may select a resistor and change its resistance.

Electrical components are typically added to (e.g., printed) or on one or more surfaces of mechanical components of the design. For example, mechanical design engine 201 may be used to add a substrate for a 3D design, and electrical design engine 202 may be used to add circuitry to that substrate. The 3D printer may use the same digital model to form the design for both the mechanical and electrical components, but use different materials for the different parts of the designs. For example, as noted, the 3D printer may use conductive or semi-conductive materials for the electrical portion of the design and non-conductive materials for the mechanical portion of the design. The specific materials that are used may be determined by a user of the system or may be determined by the system itself based on the design.

In some implementations, the user may provide operational specifications for the mechanical and/or electrical portions of the design, and the system may then select appropriate materials to meet those specifications. For example, a user may specify a maximum resistance or acceptable resistance range for conductive traces. In response, the system may suggest an appropriate conductor for traces in the design. In another example, a user may specify a particular hardness or elasticity of a mechanical component of the design. In response, the system may suggest appropriate material(s) for the mechanical portion. In some implementations, the user may be presented with an option to accept, reject, or modify the system's suggestions for each portion of the design.

In some implementations, electrical design engine 202 may automatically generate electrical pathways between added electrical components. For example, if a user adds a resistor and a capacitor to a design, the user may select both and instruct the system to add an electrical pathway between the two. The electrical pathway may have one or more user- or system-defines attributes, such as path length, resistance, shielding, and so forth.

In some implementations, mechanical design engine 201, either alone or in combination with electrical design engine 202, automatically generates mechanical supports for electrical components added to a design. For example, the system may add, to the design, any appropriate structure necessary to hold added electrical circuitry, without being specifically instructed by the user to generate such holding structures. The structure(s) may be made of appropriate material(s) so as not to interfere with electrical operation of the electrical circuitry. The structure(s) may include, but are not limited to, holders or frames for securing one or more added or selected electrical components in the design.

In some implementations, the electrical and mechanical design engines are integrated such that selection of a component for inclusion in the design includes automatic or manual configuration of both electrical and mechanical requirements for an included component. For example, the electrical and mechanical design engines may communicate with each other so as to reduce the chances that one portion of the design (e.g., the mechanical portion) will adversely affect another portion (e.g., the electrical portion) of the design. Accordingly, integration of the electrical and mechanical design engines may reduce the chances that changes to the electrical portion of the design will adversely affect mechanical portions of the design or that changes to the mechanical portion of the design will adversely affect electrical portions of the design. In an example, adding a conductive mechanical structure that comes into contact with an electrical pathway from the electrical portion of the design will cause a short circuit and affect operation of the electrical portion of the design. The electrical and mechanical design engines may communicate to identify the adverse effects resulting from addition of the conductive mechanical structure. The system may then suggest an alternate arrangement or prompt the user to provide an alternative arrangement (e.g., one that replaces the conductive mechanical structure with a non-conductive mechanical structure)

Figure 8:
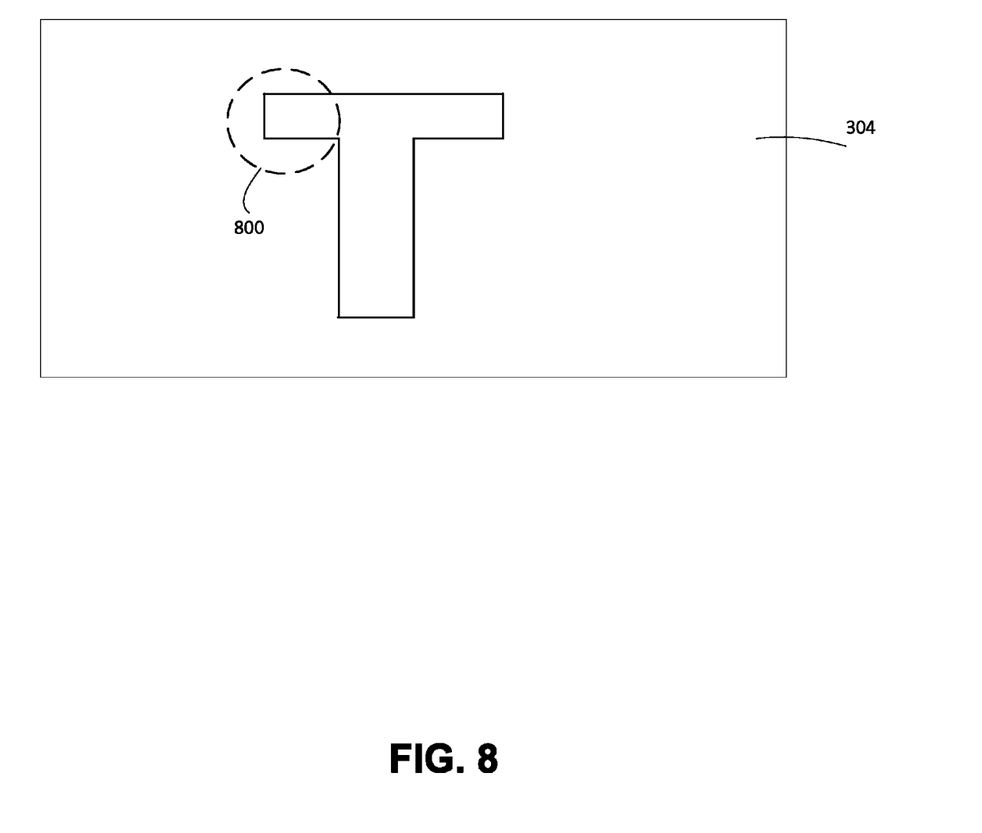
FIG. 8 is an example of a design produced by the layout tool.

Example 3D printing system 100 also includes constraint engine 203. In this example, constraint engine 203 identifies a specific 3D printer to be used to print a design based on the digital model. Constraint engine 203, in cooperation with mechanical design engine 201 and electrical design engine 202, provides design constraints, including feedback for inoperative or impermissible configurations of one or more mechanical components or electrical components (or pathways) associated with the design. In an example, constraint engine 203 determines if the 3D printer being used by the system (e.g., 3D printer 102) is capable of building the design defined by the digital model. In this regard, as noted above, some types of 3D printers build a structure by printing relatively thin layers of material, one on top of the other, until the desired 3D structure is formed. This is sometimes referred to colloquially as 2.5D printing. Other types of 3D printers may be configured to build the structure by adding material three-dimensionally. That is, rather than forming a 3D structure by accumulating layers of material, these printers build the 3D structure by moving a print head in three dimensions and adding material wherever is needed in order to build the 3D structure. For example, if a vertical column is to be printed, the print head may be moved vertically while printing to form the vertical column. If the 3D printer is of the former type (one that builds by accumulating layers), and the design defined by the digital model includes an overhang (e.g., overhang 800 of FIG. 8), then the constraint engine may issue an error message advising the user that the design is not compatible with the 3D printer being used. This is because an overhang cannot be produced by accumulating layers (since there is no layer beneath the overhang). The constraint engine may instruct the user to use a different 3D printer or to modify the design based on the type of 3D printer that is currently available. Suggestions for modifying the design may be provided, along with the opportunity to accept, to reject, or to revise the suggestions.

Examples of constraints that may limit what types of 3D models can be built by a particular 3D printer include, but are not limited to, printer filament type (e.g., material), filament feeding rate, desired layer height, desired layer thickness, filament fill density, print speed while printing, operational temperature, filament diameter, printer retraction capabilities, print head travel speed and corresponding motor speed, and print order sequence.

In some implementations, system 100 includes a printer configuration tool 212. Printer configuration tool 212 is configured to provide a control for selecting a specific 3D printer for use in printing the design. Printer configuration tool 212 may be operable to evaluate a proposed design based on the selected 3D printer and to provide one or more recommendations regarding changes to be made to the design to accommodate printing on the selected 3D printer.

More specifically, in some implementations, printer configuration tool 212 may evaluate aspects of a digital model defining a design and select a 3D printer that is best able to reproduce the design. For example, printer configuration tool 212 may identify that a design has overhanging features, and determine that a 3D printer having a printer head that prints in three dimensions (as opposed to one that forms structure by accumulating layers) is an appropriate choice. If available, printer configuration tool 212 selects that 3D printer and, if not available, suggests the 3D printer best able to reproduce the design is selected.

In some implementations, a 3D printer that is capable of reproducing a particular design may not be available. For example, a design may have a structural overhang or include a conductive trace made of a particular type of conductive material, while, of the available 3D printers, none are capable of reproducing a structural overhang or of including a conductive trace made of that particular type of conductive material. Accordingly, printer configuration tool 212, working in conjunction with mechanical design engine 201, electrical design engine 202 and/or constraint engine 203, may provide recommendations for changes to the design that will allow an available 3D printer to build the design. In some implementations, the system may require user approval before such changes will be accepted. In some implementations, the changes may be implemented automatically (e.g., without user approval), and an appropriate 3D printer selected for use. In some implementations, the user may be presented with two or more options for changing the design, along with information identifying 3D printers capable of printing each option and the operational parameters (e.g., print speed, available materials, etc.) associated with each printer. A user may then select an option and corresponding 3D printer for use to build the design.

Example 3D printing system 100 also includes simulation engine 204. Simulation engine 204 may simulate electrical and/or mechanical performance of the design defined by the digital model based on components included in the design, such as electrical pathways and movable and stationary mechanical components. Simulation engine 204 may use the library of virtual electrical components that correspond to the components in the digital model, arrange those virtual components in the manner set forth in the model, and apply appropriate stimuli in order to simulate the electrical portion of the model In this regard, simulation engine 204 may simulate the interoperability of the various electrical and mechanical components. In an example implementation, simulation engine 204 may perform a simulation to confirm the operation of (e.g., electrical performance) the electrical circuitry in the design. The simulation engine may also perform a simulation to confirm the operation of the mechanical components of the design. The simulation engine may also perform a simulation to confirm that interaction between electrical and mechanical components of the design. The results of the simulation may be displayed to the user, along with an option to confirm the design based on the simulation results. In some implementations, the system may provide the user with performance information for the simulated design. In response, the user may change one or more components of the design to meet the requested performance information.

In some implementations, simulation engine 204 includes a recommendation component 213 to recommend changes to mechanical and/or electrical portions of the design based on one or more simulations. For example, in some implementations, the user may provide the system with minimum performance specifications for one or more aspects of the design. If, after one or more simulations, the design does not meet one or more of those performance specifications, the recommendation component may provide a suggestion about changes to electrical and/or mechanical portions of the design that may be made in order for the design to meet, within some tolerance, the minimum performance specifications. For example, if one of the performance specifications is a minimum path resistance in a particular electrical pathway, the recommendation component may recommend a different material or different routing for the pathway so as to achieve the specified minimum path resistance. In another example, chip placement may affect power consumption, and the recommendation component may suggest a particular chip placement in order to achieve a desired power consumption. The recommendation component may also make suggestions about changing mechanical portions of a design. For example, if a moving mechanical part having a conductive portion comes into contact with a conductive trace on the design, and an unintended short circuit is created, the recommendation component may suggest a different placement or operation for that mechanical component.

In some implementations, simulation engine 204 includes a simulation environment for simulating integration of the electrical and mechanical portions of the design including, e.g., verifying functional requirements of the design that include both mechanical and electrical parameters. In this regard, the simulation engine may generate, from the structure and functional characteristics of the design, executable instructions that model the structural and functional aspects of the model. The instructions may be executed, with appropriate electrical and/or mechanical stimuli being simulated in the instructions. The resulting behavior of the design may then be determined and presented graphically to the user in the simulation environment. For example, the graphics may include a virtual 3D view of the model showing its behavior in response to various stimuli. The graphics may include tables and/or plots showing various non-visible parameters and their various, e.g., over time.

The 3D printing system may include a fabrication support engine 214 that is configured to evaluate a fabrication potential associated with the design, including providing suggestions for improving the design based on fabrication parameters associated with the 3D printer. Fabrication support engine 214 knows, or determines, the operating parameters of a selected 3D printer and determines if the 3D printer can build the design based on the operational parameters. In this example implementation, fabrication support engine 214 differs from constraint engine 203 in that constraint engine 203 determines whether the 3D printer is actually capable of performing functions that are necessary to build a design (such as printing vertically). In contrast, fabrication support engine 214 determines whether parameters of the design are within operational parameters of the 3D printer, not whether the 3D printer is capable of actually building the design. For example, the design may specify dimensions to hundredths of an inch, while the 3D printer may only accept dimensions to tenths of an inch. In another example, the design may specify a silver-based conductive material, while the 3D printer is only capable of printing copper-based conductive materials.

In some implementations, when fabrication support engine 214 determines that parameters of a design are not within operational parameters of the 3D printer, fabrication support engine 214 may advise the user (e.g., via a computer graphic) and prompt the user to adjust the parameters of the design so that they comport with the operational parameters of the 3D printer. In some implementations, fabrication support engine 214 may modify parameters of the design so that those parameters are within the scope of the operational parameters of the 3D printer, and prompt the user to accept the modified parameters via a computer graphic. In some implementations, fabrication support engine 214 may modify parameters of the design so that those parameters are within the scope of the operational parameters of the 3D printer, and automatically (e.g., without user approval) change the parameters of the design so that they are within the scope of the operational parameters of the 3D printer. In the above examples, for instance, the fabrication support engine may provide a graphic advising that the design specifies dimensions to hundredths of an inch, while the 3D printer only accepts dimensions to tenths of an inch; or that the design specifies a silver-based conductive material, while the 3D printer is only capable of printing copper-based conductive materials. In some implementations, the graphic may prompt the user to make an adjustment, whereas in other implementations, the system may make the correction itself, while ensuring that the correction does not interfere with other aspects of the design, and either implement the correction automatically or implement the correction in response to user input.

In some implementations, fabrication support engine 214 is operable to produce metadata for use in producing instructions for the 3D printer. To this end, fabrication support engine 214 may analyze the 3D model, including identifying its structure, dimensions, specified materials, and so forth. Based on this analysis, fabrication support engine 214 generates, and associates with, the digital model, metadata specifying parameters that may be used to construct a 3D structure from the digital model. The metadata may be stored in association with the 3D model, either on a local computer system or on a remote server. A print engine 216 may evaluate the design, including the metadata, and generate instructions to 3D printer 102 to build the design. Print engine 216 may output appropriate print instructions associated with the design to control printing of the mechanical and electrical portions of the design.

Figure 9:
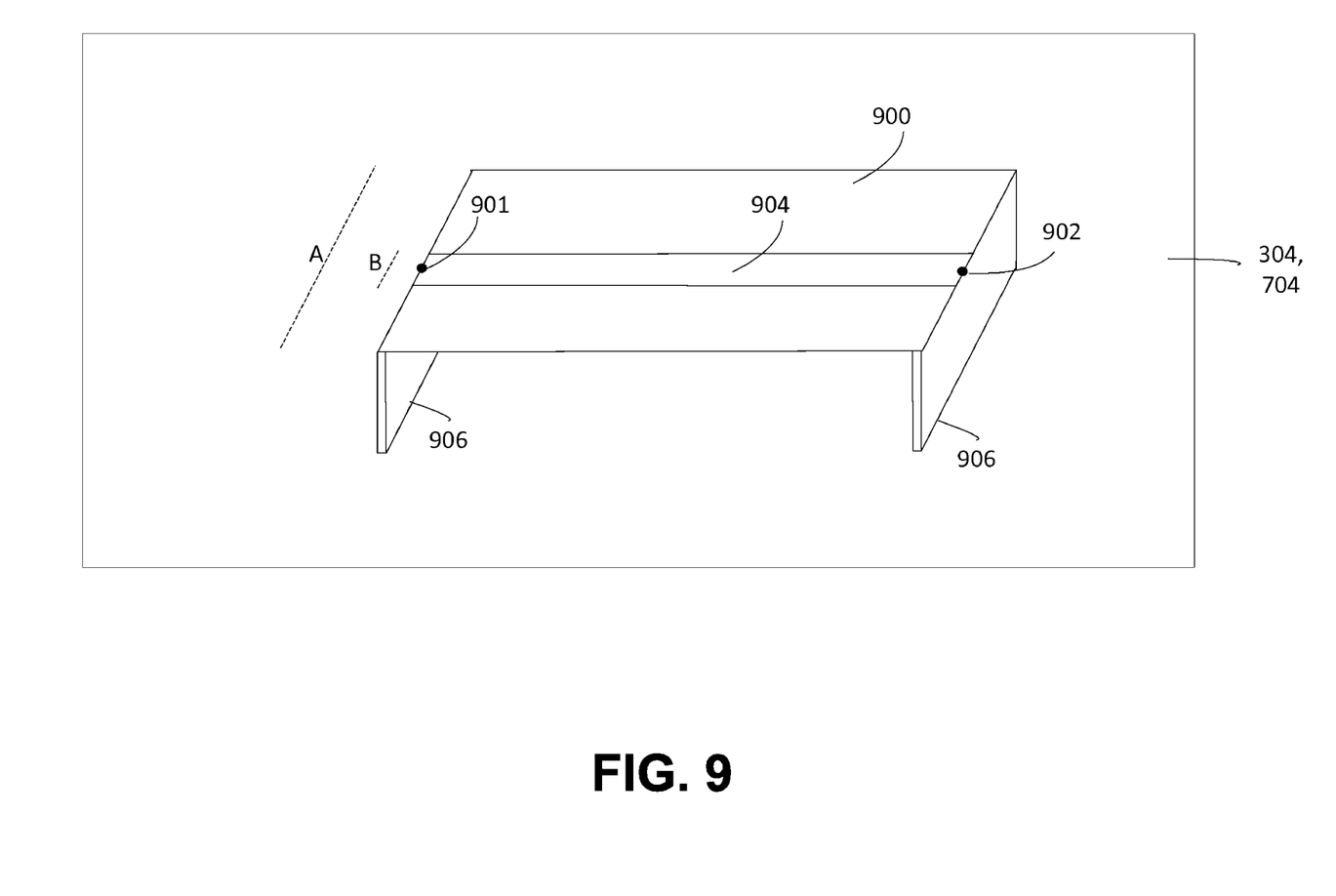
FIG. 9 is an example of a design produced by the layout tool.

In this regard, instructions may include, e.g., instructions identifying movement of the printer head, dimensions of the components to be produced, amounts and types of material to print and in what locations, and so forth. For example, referring to the digital model of FIG. 9, print engine 216 may generate instructions for the 3D printer to produce dielectric 900 from points 901 to points 902 having a width value of A, and then to print a copper-based conductive material 904 on the dielectric from points 901 to 902 and having a width B. Depending upon the type 3D printer used, the instructions may also include instructions to move the print head vertically to produce holding structures 906 or to print materials in layers, one on top of the other, to produce holding structure 906. Thus, the instructions may include alternating instructions to print mechanical, electrical, then mechanical structures in support of the design.

The instructions may include one or more pause or control instructions for controlling the 3D printer when printing the design. The pause or control instructions may enable alternating between different materials for use in printing the design or placement of external components on the design. In this regard, as explained above, in some cases, external components (e.g., non-printed components) may be incorporated into a 3D design that is to be built by a 3D printer. For example, one or more transistors may be incorporated into circuitry, the remainder of which is built using 3D printing. In other examples, springs, pistons, or other mechanical structures may be incorporated into the mechanical portion of a 3D design, the remainder of which is built using 3D printing. Components such as these may be incorporated into the design manually or using automated tool(s), such as an industrial robot. In some implementations, the 3D printing is instructed to stop, or is paused, so as to permit such components to be added to the design, e.g., secured in place with appropriate electrical and/or mechanical connections.

Fabrication support engine 214 may identify times during the 3D printing process when it is appropriate to pause printing so as, e.g., to enable incorporation of non-3D printed components into the structure. Appropriate pauses may be noted in the metadata, and translated into control instructions by the print engine. Printing may resume in response to user input or after a specified time. For example, if it is known that a robot will take thirty seconds to incorporate a transistor into a structure, the 3D printer may be controlled to pause for forty seconds to allow the robot (which will also receive appropriate operational instructions) to incorporate the transistor, and then controlled to resume printing. In some implementations, checks may be made to confirm that the component incorporated into the 3D structure is correctly connected and, only after that has been confirmed does 3D printing resume.

Pause instructions may also be incorporated so as to allow the 3D printer to switch between printing materials. In this regard, it may take time for the 3D printing system to switch between print materials, such as a plastic and a metal (for, respectively, printing structural and electrical components of a design). Pause instructions may be inserted at appropriate times to allow the 3D printer to stop printing, switch material(s), and resume printing.

The 3D printing system described herein is not limited to the implementations described above. For example, one or more features (e.g., engines) of the 3D printing system may be eliminated, reconfigured or operate differently. Hardware and software may vary among implementations.

All or part of the systems and corresponding processes described herein and their various modifications (hereinafter referred to as "the processes") can be implemented, at least in part, via a computer program product, e.g., a computer program tangibly embodied in one or more non-transitory machine-readable storage media (e.g., hardware devices, such as a hard drive, computer memory, or the like), for execution by, or to control the operation of, data processing apparatus, e.g., a programmable processor, a computer, multiple computers, multiple cores of a processor, and so forth.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more mass storage devices for storing data, e.g., magnetic, magneto-optical disks, or optical disks. Information carriers suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different implementations described herein may be combined to form other implementations not specifically set forth above. Other implementations not specifically described herein are also within the scope of the following claims.

What is claimed is:

1. A computer system including a layout tool, comprising:
a mechanical design engine for configuring mechanical design components to be included in a design, the mechanical design engine for generating for display a user interface (UI) for manipulation by a user for constructing the design, the UI comprising a plurality of tools for placing mechanical components included in a library and for constructing mechanical components for inclusion in the design, the design to be printed on a three-dimensional (3D) printer;
an electrical design engine for configuring electrical components to be included in the design, the electrical design engine for generating for display a UI for manipulation by a user for laying out electrical pathways associated with an electrical portion of the design, the electrical pathways to be printed adjacent to one or more surfaces of mechanical components of the design, the electrical design engine comprising an optimization engine for optimizing the electrical pathways based, at least in part, on 3D aspects of the design, the optimization engine configured to review the design and to propose electrical pathways that satisfy electrical needs of the design while taking into account 3D structures included in the design;
a constraint engine for identifying the 3D printer to be used to print the design and to provide design constraints including feedback for inoperative or impermissible configurations of one or more mechanical components or electrical pathways associated with the design before the design is printed on the 3D printer;
a simulation engine for simulating, at least, electrical performance of the design, based on one or more electrical components added to the design and the electrical pathways; and
a library of electrical components that is accessible by the simulation engine to simulate electrical performance of the design.

2. The computer system including the layout tool of claim 1, wherein the electrical design engine is configured to enable layout of the electrical pathways through automatic or manual conductive trace placement on the design.

3. The computer system including the layout tool of claim 1, wherein the simulation engine is configured to perform simulations for performance testing of electrical performance of the design.

4. The computer system including the layout tool of claim 1, wherein the simulation engine comprises a recommendation component to recommend changes to mechanical or electrical portions of the design based on one or more simulations.

5. The computer system including the layout tool of claim 1, wherein the electrical design engine and the mechanical design engine are integrated such that selection of a component for inclusion in the design comprises automatic or manual configuration of both electrical and mechanical requirements for the component.

6. The computer system including the layout tool of claim 5, wherein selection of an electrical component comprises automatic generation of electrical pathways to support functionality of the electrical component in the design, along with automatic generation of one or more mechanical supports to facilitate mounting the electrical component in the design.

7. The computer system including the layout tool of claim 6, wherein the one or more supports include mechanical holders or frames for securing the electrical component in the design.

8. The computer system including the layout tool of claim 1, further comprising a fabrication support engine configured to evaluate a fabrication potential associated with the design, the fabrication support engine being configured to provide suggestions for improving the design based on fabrication parameters associated with the 3D printer.

9. The computer system including the layout tool of claim 8, wherein the fabrication support engine is further configured to produce metadata to be associated with the design, the metadata being usable in instructions for the 3D printer to print the design.

10. The computer system including the layout tool of claim 9, wherein the instructions comprise one or more pause or control instructions for controlling the 3D printer when printing the design to enable alternating between different materials for use in printing the design or placement of external components on the design.

11. The computer system including the layout tool of claim 1, further comprising a printer configuration tool configured to provide a control for selecting a 3D printer for use in printing the design;
wherein the constraint engine is configured to evaluate the design based on a selected 3D printer and to provide one or more recommendations regarding changes to be made to the design to accommodate printing on the selected 3D printer.

12. The computer system including the layout tool of claim 1, further comprising a print engine for evaluating the design, and for outputting print instructions associated with the design to control printing of mechanical and electrical portions of the design.

13. The computer system including the layout tool of claim 12, wherein the instructions comprise alternating instructions to print mechanical, electrical, then mechanical structures in support of the design.

14. The computer system including the layout tool of claim 12, wherein the simulation engine is configured to operate in a simulation environment for simulating an integration of electrical and mechanical portions of the design, the simulating comprising verifying functional requirements of the design that include both mechanical and electrical parameters.

15. The computer system including the layout tool of claim 1, wherein the design is printable on a 3D printer, which generates structure by additive layering.

16. The computer system including the layout tool of claim 1, wherein the design is printable on a 3D printer, which generates structure by printing in three dimensions.

17. The computer system including the layout tool of claim 1, wherein the UI is configured to accept freeform drawings and to generate at least part of the design based on the freeform drawings.

18. One or more non-transitory machine-readable storage media storing instructions that are executable on one or more processing devices to perform operations comprising:

configuring mechanical design components to be included in a design, wherein configuring the mechanical design components comprises generating for display a user interface (UI) for manipulation by a user for constructing the design, the UI comprising a plurality of tools for placing mechanical components included in a library and for constructing mechanical components for inclusion in the design, the design to be printed on a three-dimensional (3D) printer, configuring electrical components to be included in the design, wherein configuring the electrical components comprises generating for display a UI for manipulation by a user for laying out electrical pathways associated, with an electrical portion of the design, the electrical pathways to be printed on one or more surfaces of mechanical components of the design, and optimizing the electrical pathways based, at least in part, on 3D aspects of the design, the optimizing comprising reviewing the design and proposing electrical pathways that satisfy electrical needs of the design while taking into account 3D structures included in the design;

identifying the 3D printer to be used to print the design and providing design constraints including feedback for inoperative or impermissible configurations of one or more mechanical components or electrical pathways associated with the design before the design is printed on the 3D printer;

providing a library of electrical components for simulating electrical performance of the design; and simulating, at least, electrical performance of the design based on one or more electrical components added to the design and the electrical pathways.

19. A three-dimensional (3D) printing system comprising:
a 3D printer; and
a computer system comprising one or more non-transitory machine-readable storage media and one or more processing devices, the one or more non-transitory machine-readable storage media storing instructions that are executable by the one or more processing devices to generate a design for printing by the 3D printer, the instructions defining various engines comprising:

a mechanical design engine for configuring mechanical design components to be included in a design, the mechanical design engine for generating for display a user interface (UI) for manipulation by a user for constructing the design, the UI comprising a plurality of tools for placing mechanical components included in a library and for constructing mechanical components for inclusion in the design, the design to be printed on the 3D printer, an electrical design engine for configuring electrical components to be included in the design, the electrical design engine for generating for display a UI for manipulation by a user for laying out electrical pathways associated with an electrical portion of the design, the electrical pathways to be printed on one or more surfaces of mechanical components of the design, the electrical design engine comprising an optimization engine for optimizing the electrical pathways based, at least in part, on 3D aspects of the design, the optimization engine configured to review the design and to propose electrical pathways that satisfy electrical needs of the design while taking into account 3D structures included in the design;

a constraint engine for identifying the 3D printer to be used to print the design and to provide design constraints including feedback for inoperative or impermissible configurations of one or more mechanical components or electrical pathways associated with the design before the design is printed on the 3D printer;

a simulation engine for simulating, at least, electrical performance of the design based on one or more electrical components added to the design and the electrical pathways; and a library of electrical components that is accessible by the simulation engine to simulate electrical performance of the design.

20. The one or more non-transitory machine-readable storage media of claim 18, wherein the electrical design engine and the mechanical design engine are integrated with each other and the operations comprise configuring of both electrical and mechanical requirements for a component responsive to selection of the component for inclusion in the design.

21. The 3D printing system of claim 19, wherein the electrical design engine and the mechanical design engine are integrated such that selection of a component for inclusion in the design comprises automatic or manual configuration of both electrical and mechanical requirements for the component.

* * * * *

UNITED STATES PATENT AND TRADEMARK OFFICE
CERTIFICATE OF CORRECTION

| | | |
|---|---|---|
| PATENT NO. | : 9,744,727 B2 | Page 1 of 1 |
| APPLICATION NO. | : 14/243274 | |
| DATED | : August 29, 2017 | |
| INVENTOR(S) | : Karl Willis | |

It is certified that error appears in the above-identified patent and that said Letters Patent is hereby corrected as shown below:

In the Claims

Column 17, Line 29, in Claim 18: delete "associated," and insert --associated--, therefor.

Column 18, Line 7, in Claim 19: delete "(UT)" and insert --(UI)--, therefor.

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*